US005132565A

United States Patent [19]

Kuzumoto

[11] Patent Number: 5,132,565

[45] Date of Patent: Jul. 21, 1992

[54] SEMICONDUCTOR INTEGRATED CIRCUIT INCLUDING VOLTAGE LEVEL SHIFTING

[75] Inventor: Takatoshi Kuzumoto, Sakurai, Japan

[73] Assignee: Sharp Kabushiki Kaisha, Japan

[21] Appl. No.: 677,324

[22] Filed: Mar. 29, 1991

[30] Foreign Application Priority Data

Nov. 16, 1990 [JP] Japan .................................. 2-312525

[51] Int. Cl.[5] .......................................... H03K 19/003

[52] U.S. Cl. .................................. 307/443; 307/451; 307/296.8

[58] Field of Search ............... 307/448, 475, 450, 451, 307/452, 453, 558, 559, 546, 548, 264, 270, 443, 296.8

[56] References Cited

U.S. PATENT DOCUMENTS 4,125,788 11/1978 Kohman .............................. 307/475
4,194,135 3/1980 Christopherson ................... 307/475
4,456,838 6/1984 Taguchi et al. ................. 307/475 X
4,476,426 10/1984 Kishimoto et al. ............. 307/558 X
4,728,821 3/1988 Yang et al. ....................... 387/559 X
4,801,824 1/1989 Fellinger et al. ................... 307/558
4,818,901 4/1989 Young et al. ................... 307/546 X
4,833,342 5/1989 Kiryu et al. .................... 307/559 X
5,021,691 6/1991 Saito ............................... 307/559 X

*Primary Examiner*—David Hudspeth
*Attorney, Agent, or Firm*—Nixon & Vanderhye

[57] ABSTRACT

A semiconductor integrated circuit has an applied external voltage detector (3) which determines if a level of an applied external voltage (Vex) exceeds a threshold level. When the applied external voltage does not exceed the threshold voltage, an internal voltage selector (4) selects and outputs to a voltage drop circuit (10) a constant reference voltage which is generated and dropped from the applied external voltage by a reference voltage generator (1), based on an output of the applied external voltage detector. The voltage drop circuit generates and applies an internal voltage equal to the constant reference voltage, i.e. a dropped applied external voltage to internal circuit. On the other hand, when the applied external voltage exceed the threshold voltage, the internal voltage selector selects an aging voltage output from an aging voltage generator (2), based on an output of the applied external voltage detector. The aging voltage is higher than the constant reference voltage, and is dependent upon the applied external voltage. An internal voltage equivalent to the aging voltage is generated and applied to the internal circuit by the voltage drop circuit.

7 Claims, 5 Drawing Sheets

SEMICONDUCTOR INTEGRATED CIRCUIT INCLUDING VOLTAGE LEVEL SHIFTING

BACKGROUND OF THE INVENTION

The present invention relates to a semiconductor integrated circuit which drops a voltage received from an external power supply before application of the voltage to an internal circuit.

Precision processing technologies have advanced with each new generation of semiconductor integrated circuit, enabling to reduce transistor size and to increase sensitivity. With this increased sensitivity and reduced transistor size, the current flowing through transistor channels produces hot electrons which can degrade the transistor. The voltage applied to the transistors can be reduced to prevent these hot electrons, but it is not possible to lower the voltage applied to by the external power supply (hereinafter applied external voltage) due to problems which would then be caused in assuring the operation of the overall system. As a result, the applied external voltage has conventionally been lowered inside the semiconductor integrated circuit before applying the voltage to the internal circuits (component parts, including the transistors).

In a conventional semiconductor integrated circuit as shown in FIG. 5, resistance R11, and n-channel transistors NT11, NT12, and NT13 are connected in sequence between the external power supply (applied external voltage Vex) and the ground, and the sum of the threshold voltages Vth of the n-channel transistors NT11, NT12, and NT13 is extracted as the reference voltage Vref from the connection of resistance R11 and n-channel transistor NT11. It is to be noted that the gates of the n-channel transistors NT11, NT12, and NT13 are each connected to the power supply side terminal of each transistor. Note also that a p-channel transistor PT11 is connected between the external power supply and the internal circuit Z. The reference voltage Vref is the input to the inversion terminal of the differential amplifier OP11, the internal voltage Vint occurring at the connection T11 between the p-channel transistor PT11 and the internal circuit Z is the non-inversion input of the differential amplifier OPII, and the differential amplifier OP11 controls the conductance of the p-channel transistor PT11 so that the potential difference (Vint - Vref) is approximately zero. In other words, a voltage drop circuit 10 is formed from the differential amplifier OP11 and p-channel transistor PT11, and this voltage drop circuit 10 generates an internal voltage Vint of a degree approximately equal to the reference voltage Vref, i.e., the sum of the threshold voltages Vth of the n-channel transistors NT11, NT12, and NT13, irrespective of the level of the applied external voltage Vex and the internal circuit Z.

However, the qualitative requirements placed on semiconductor integrated circuits today are extremely high, and major components such as transistors must be aged at a high temperature and high voltage to eliminate any latent defects. However, because conventional semiconductor integrated circuits as described above drop the applied external voltage Vex to an approximately constant internal voltage Vint, a high voltage cannot be applied to the internal circuits by raising the value of the applied external voltage Vex.

In addition, when the applied external voltage Vex is applied directly to the internal circuit the transistor life is shortened as described above.

SUMMARY OF THE INVENTION

Therefore, an object of the present invention is to provide a semiconductor integrated circuit which during normal operation can drop an applied external voltage to apply an approximately constant internal voltage to an internal circuit, and which during aging can apply a high voltage corresponding to the applied external voltage to the internal circuit.

In order to accomplish the above object, there is provided a semiconductor integrated circuit which drops an applied external voltage received from an external power supply and applies a dropped voltage to an internal circuit, and which comprises a reference voltage generator which receives the applied external voltage and drops the applied external voltage to generate a constant reference voltage, an aging voltage generator which receives the applied external voltage and generates an aging voltage according to a level of the applied external voltage, an applied external voltage detector which receives the applied external voltage, determines whether a level of the applied external voltage exceeds the threshold level between a normal operating voltage and an aging voltage, and outputs a binary signal expressing the result of this determination, an internal voltage selector which, based on the binary signal output from the applied external voltage detector, selects the constant reference voltage from the reference voltage generator when the applied external voltage does not exceed said threshold voltage, and selects the aging voltage from the aging voltage generator when the applied external voltage does exceed said threshold voltage, and a voltage drop circuit to which is input as a control voltage the constant reference voltage or the aging voltage generated by the reference voltage generator or aging voltage generator, respectively, and selected by the internal voltage selector, and which drops the applied external voltage to a level equal to said control voltage.

When the applied external voltage does not exceed the threshold voltage between the normal operating voltage and the aging voltage (i.e., during normal operation), the applied external voltage detector outputs a signal indicating that this threshold voltage is not exceeded, and the internal voltage selector outputs the output of the reference voltage generator based on this signal. As a result, the constant reference voltage equivalent to a dropped external voltage is selected. Thus, an internal voltage is generated by a voltage drop circuit to equal this constant reference voltage, and is applied to the internal circuit.

On the other hand, when the applied external voltage exceeds the threshold voltage between the normal operating voltage and the aging voltage (i.e., during an aging operation), the applied external voltage detector outputs a signal indicating that this threshold voltage is exceeded, and the internal voltage selector outputs the output of the aging voltage generator based on this signal. As a result, the aging voltage (a voltage higher than the constant reference voltage) dependent upon the applied external voltage is selected. Thus, an internal voltage is generated by the voltage drop circuit to equal this aging voltage, and is applied to the internal circuit. As a result, an internal voltage of a level dependent upon the level of the applied external voltage is applied to the internal circuit.

As will be known from the above, the semiconductor integrated circuit according to the present invention can apply to the internal circuit an approximately constant internal voltage dropped from the applied external voltage by means of the voltage drop circuit during normal operation, and can apply to the internal circuit a high voltage according to the level of the applied external voltage during aging, because the approximately constant reference voltage dropped from the applied external voltage is generated by the reference voltage generator and the aging voltage corresponding to the level of the applied external voltage is generated by means of the aging voltage generator, the applied external voltage detector determines whether the applied external voltage exceeds the threshold level, and the internal voltage selector selects and outputs to the voltage drop circuit either the output from the reference voltage generator or the aging voltage generator based on the output of the applied external voltage detector.

BRIEF DESCRIPTION OF THE DRAWINGS

The present invention become more fully understood from the detailed description given hereinbelow and the accompanying drawings which are given by way of illustration only, and thus are not limitative of the present invention, and wherein.

DETAILED DESCRIPTION OF THE PREFERRED EMBODIMENT

The preferred embodiments of a semiconductor integrated circuit according to the present invention are described hereinbelow with reference to the accompanying figures.

Figure 1:
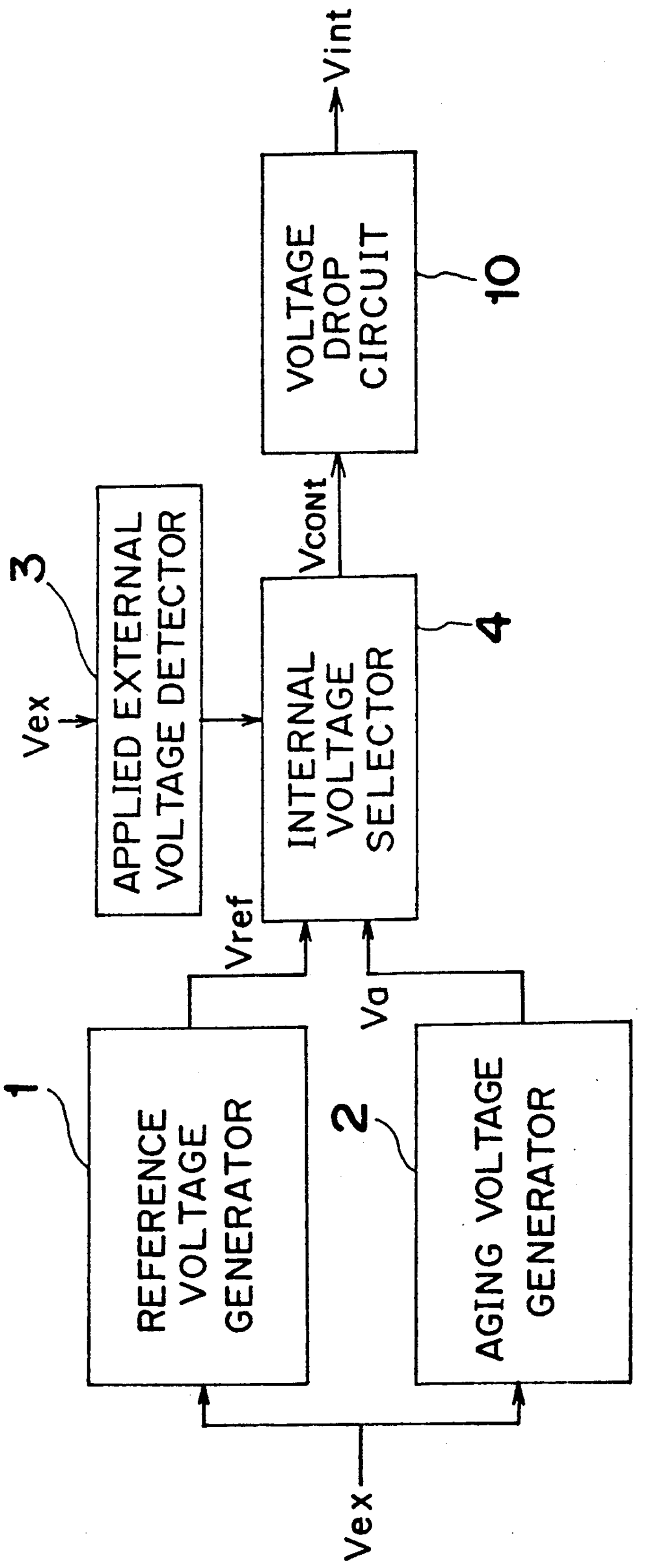
FIG. 1 is a block diagram of a semiconductor integrated circuit according to the present invention.
Figure 2A:
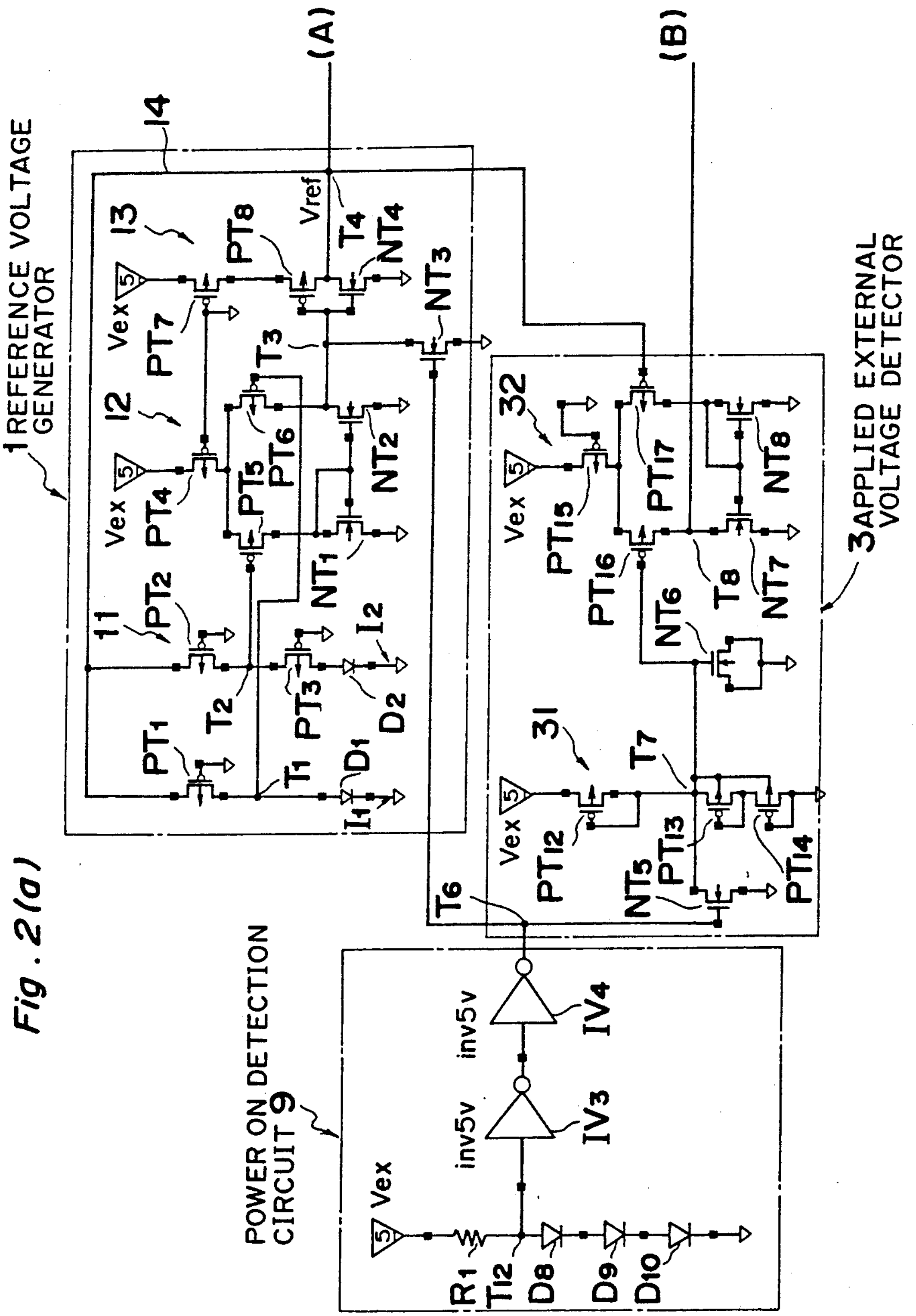
FIGS. 2(*a*) and 2(*b*) are circuit diagrams of a semiconductor integrated circuit according to the preferred embodiment of the present invention.
Figure 2B:
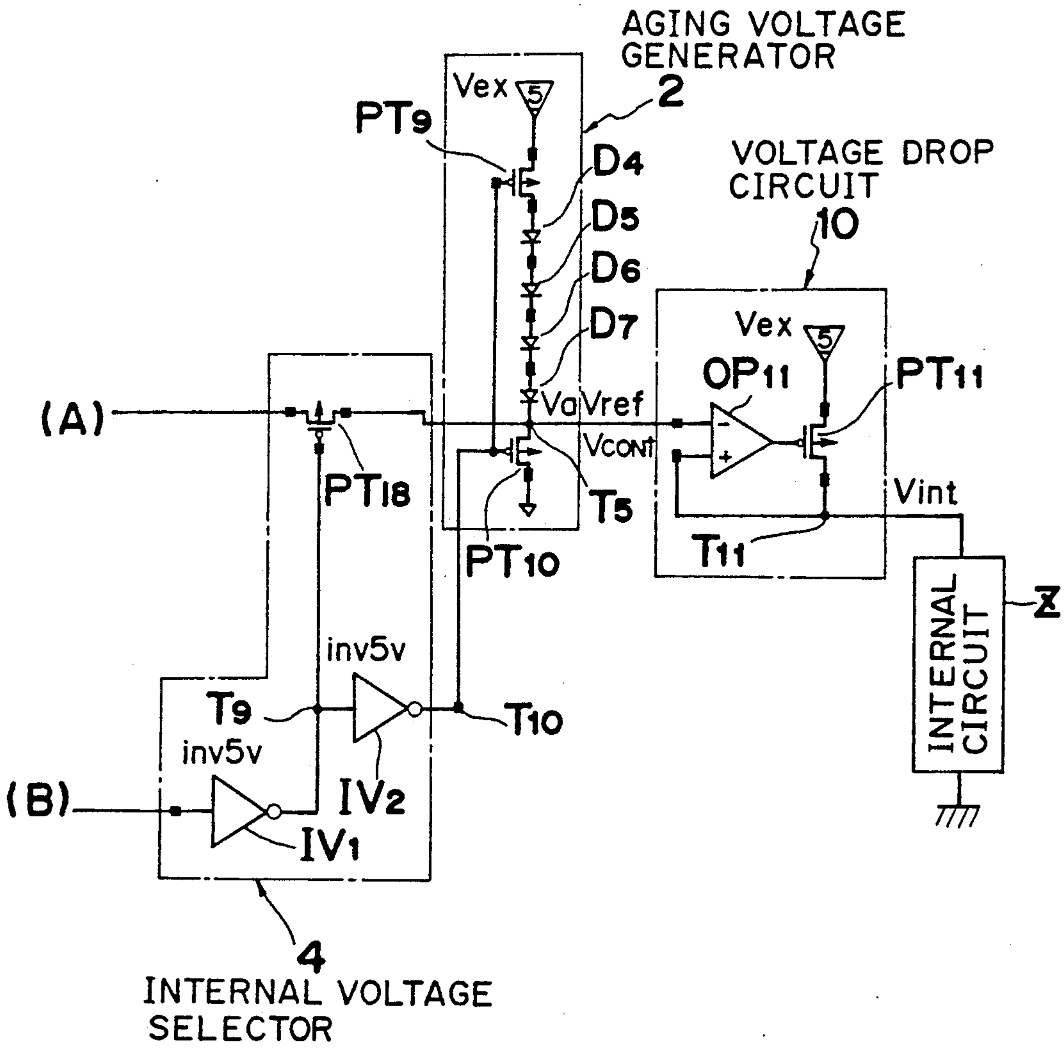

As shown in FIGS. 1, 2(*a*) and 2(*b*), this semiconductor integrated circuit comprises a reference voltage generator 1, aging voltage generator 2, applied external voltage detector 3, internal voltage selector 4, power on detection circuit 9, and voltage drop circuit 10. It is to be noted that terminals (A) and (B) in FIG. 2(*a*) are connected to the same in FIG. 2(*b*) respectively.

As shown in FIG. 2(*a*), the reference voltage generator 1 comprises a potential difference generator 11, a differential amplifier formed from a comparator 12 and output buffer 13, and an n-channel transistor NT3 connected between the ground (indicated by an inverted triangle in the figures) and connection T3, which is between the comparator 12 and the output buffer 13.

The potential difference generator 11 comprises p-channel transistors PT1, PT2, and PT3, which function as electrical resistances, and two diodes D1 and D2, each with a different junction area. The transistor PT1 and diode D1 constitute one current path I1 connected to the ground, and the transistors PT2 and PT3 and the diode D2 constitute a current path I2 parallel to the current path I1. The junction area ratio of the two diodes D1 and D2 is set at 1:10; when current is applied to these diodes D1 and D2, a potential differential of approximately 60 mV is generated at the anodes of the diodes (with diode D2 having the lower potential) regardless of the ambient temperature. In addition, the ON resistance of the transistors PT1 and PT2 is set equal, and the ratio of the ON resistance of the transistors PT2 and PT3 is set to approximately 20:1. Thus, the connection T1 between the transistor PT1 and the diode D1, and the connection T2 between transistors PT2 and PT3, are both set to an approximately equal potential.

The comparator 12 comprises a p-channel transistor PT4 which is connected to the external power supply 5 (i.e., the applied external voltage Vex) and functions as an electrical resistance, a pair of p-channel transistors PT5 and PT6 which are connected to the transistor PT4, and a pair of n-channel transistors NT1 and NT2 each connected between and to the ground and transistors PT5 and PT6, respectively.

The gates of the transistors PT5 and PT6 are connected respectively to the connections T2 and T1 of the potential difference generator 11, and the ON resistances of the transistors PT5 and PT6 change according to the potentials of the connections T2 and T1, respectively. The gates of the n-channel transistors NT1 and NT2 are connected to the external power supply 5 side terminal (drain) of the transistor NT1, thus forming a current mirror circuit which provides an approximately equal current to the transistors PT5 and PT6. Therefore, a signal with a level corresponding to the potential difference (negative or positive) between the connections T1 and T2 of the potential difference generator 11 is output to the output terminal (connection) T3 between the transistors PT6 and NT2.

The output buffer 13 comprises a p-channel transistor PT7 which functions as an electrical resistance and is connected to the external power supply 5, and a p-channel transistor PT8 and a n-channel transistor NT4, which are complementary and are connected in direct sequence between the p-channel transistor PT7 and the ground. The gates of both transistors PT8 and NT4 are connected to the output terminal T3, and a voltage (reference voltage) Vc is generated at the connection T4 between the transistors PT8 and NT4 according to the signal level of the output terminal T3. This voltage Vc is applied to the potential difference generator 11 as negative feedback by a line 14. A constant reference voltage Vc (here Vc=4 V) is then generated at the connection T4 by the operation of a differential amplifier formed by the comparator 12 and output buffer 13. The n-channel transistor NT3 receives an initialization signal described hereinbelow from the output terminal T6 of the power on detection circuit 9, and is turned on or off by this initialization signal.

Referring to FIG. 2(*b*), the aging voltage generator 2 is composed of a p-channel transistor PT9 connected to the external power supply 5, four diodes D4, D5, D6, and D7 serially connected to the transistor PT9, and a p-channel transistor PT10 connected between the ground and the last diode D7. The gates of the transistors PT9 and PT10 are connected to the output terminal T10 of the internal voltage selector 4, and are turned on or off by the signal level of the output terminal T10. When power is supplied, the diodes D4, D5, D6, and D7 each drop the voltage 0.5–0.6 V, resulting in a total voltage drop ΔV of 2.0–2.4 V. Therefore, when the transistors PT9 and PT10 are on, the aging voltage generator 2 generates an aging voltage Va, which is the applied external voltage Vex dropped by ΔV, at the connection T5 between the diode D7 and transistor PT10 (for simplicity, the on resistance of the transistor PT9 is ignored herein). However, when the transistors PT9 and PT10 are off, the connection T5 is at floating state.

Again, as shown in FIG. 2(*a*), the applied external voltage detector 3 has a voltage dividing generator 31 and comparator 32.

The voltage dividing generator 31 comprises three p-channel transistors PT12, PT13, and PT14, each having identical characteristics, connected serially between the ground and external power supply 5. The gates of the transistors PT12, PT13, and PT14 are each connected to the terminal (drain) on the ground side. This voltage dividing generator 31 generates at the connection T7 between the transistors PT12 and PT13 a voltage-divided voltage, which is the applied external voltage Vex voltage-divided to $\frac{2}{3}$, by means of the on resistance of the transistors PT12, PT13, and PT14.

The comparator 32 comprises a p-channel transistor PT15, which is connected to the external power supply 5 and functions as an electrical resistance, a pair of p-channel transistors PT16 and PT17 which are connected to the transistor PT15, and a pair of n-channel transistors NT7 and NT8 each connected between and to the ground and transistors PT16 and PT17, respectively. The gate of the transistor PT16 is connected to the connection T7 of the voltage-dividing generator 31, the gate of the transistor PT17 is connected to the output terminal (connection) T4 of the reference voltage generator 1, and the on resistance of the transistors PT16 and PT17 changes according to the potential of the respective connections T7 and T4. The gates of the transistors NT7 and NT8 are connected to the terminal (drain) on the external power supply 5 side of the transistor NT8, forming a current mirror circuit, and supplying an approximately equal current to the transistors PT16 and PT17.

Therefore, when the potential ($\frac{2}{3}$) Vex of the connection T7 is greater than the potential (reference voltage) Vc=4 V of the connection T4, the on resistance of the transistor PT16 becomes greater than the on resistance of the transistor PT17, and a LOW level signal is output to the output terminal T8 between the transistors PT16 and NT7. However, when the potential ($\frac{2}{3}$) Vex of the connection T7 is less than the potential (reference voltage) Vc=4 V of the connection T4, a HIGH level signal is output to the output terminal T8. In other words, the applied external voltage detector 3 outputs a LOW level signal to the output terminal T8 when the applied external voltage Vex is greater than 6V, and a HIGH level signal when the applied external voltage Vex is less than 6 V. Note that an n-channel transistor NT6 which functions as a capacitor is connected between the ground and the gate of the transistor PT16 of the comparator 32 to absorb noise. Furthermore, an n-channel transistor NT5 is connected between the ground and the connection T7 of the voltage dividing generator 31. The initialization signal output from the output terminal T6 of the power on detection circuit 9 is input to this transistor NT5, which is turned on or off according to the level of the initialization signal.

Referring to FIG. 2(*b*), the internal voltage selector 4 comprises two serially connected invertors IV1 and IV2, and a p-channel transistor PT18. The input of the invertor IV1 is connected to the output terminal T8 of the applied external voltage detector 3 shown in FIG. 2(*a*). The invertor IV1 receives either a HIGH or LOW level signal from the output terminal T8, inverts the received signal, and outputs a wave-shaped signal to the output terminal T9. Specifically, when the applied external voltage Vex is higher than 6 V, the signal output to the output terminal T9 is HIGH, and when the applied external voltage Vex is less than 6 V, the signal at output terminal T9 is LOW.

The other invertor IV2 again inverts the signal output to the output terminal T9 by the invertor IV1, and outputs the result to output terminal T10. Therefore, the signal output from the output terminal T10 is the same as that at the output terminal T8, specifically, LOW when the applied external voltage Vex is greater than 6 V, and HIGH when the applied external voltage Vex is less than 6 V. The p-channel transistor PT18 is connected between the output terminal T4 of the reference voltage generator 1 shown in FIG. 2(*a*) and the connection T5 of the aging voltage generator 2, and is turned on or off by the LOW or HIGH level signal applied to the gate from the output terminal T9 of the invertor IV1. In other words, a HIGH signal is applied to the gate when the applied external voltage Vex is higher than 6 V and the transistor PT18 becomes off, and when the applied external voltage Vex is less than 6 V, a LOW level signal is applied to the gate and the transistor PT18 becomes on. Therefore, when the applied external voltage Vex is higher than 6 V, the output terminal T4 of the reference voltage generator 1 is electrically separated from the connection T5 of the aging voltage generator 2. Because the output terminal T10 of the internal voltage selector 4 becomes LOW at this time as described above, both p-channel transistors PT9 and PT10 in the aging voltage generator 2 become on, and the level of the connection T5 becomes the aging voltage Va. When the applied external voltage Vex is lower than 6 V, conductivity exists between the output terminal T4 of the reference voltage generator 1 and connection T5 of the aging voltage generator 2. Because the output terminal T10 becomes HIGH at this time, and both p-channel transistors PT9 and PT10 become off, the level of the connection T5 becomes the reference voltage Vc.

As shown in FIG. 2(*a*), the power on detection circuit 9 comprises an electrical resistance R1 connected to the external power supply 5, three diodes D8, D9, and D10 connected serially between the resistance R1 and ground, and two invertors IV3 and IV4 serially connected to the connection T12 between the resistance R1 and the diode D8. When the external power supply 5 is turned on, the potential of the connection T12 rises together with the rise in the applied external voltage Vex, and reaches an approximately constant value when the 1.5–1.6-V voltage drop of the three diodes D8, D9, and D10 is reached. At this time the invertor IV3 is driven by the applied external voltage Vex, and receives the relative potential difference of the connection T12 based on the applied external voltage Vex as the input. Immediately after the external power supply is turned on, the input to the invertor IV3 is HIGH, but becomes LOW when the value of the applied external voltage Vex exceeds approximately 3 V. Therefore, the output of the invertor IV3 is LOW immediately after the power is turned on, and becomes HIGH after a specific amount of time. The invertor IV4 inverts the output of the first invertor IV3, and therefore outputs to the output terminal T6 an initialization signal, which is a HIGH level immediately after the power is turned on and becomes LOW after a specific period of time.

As described hereinabove, the n-channel transistor NT3 of the reference voltage generator 1 and the n-channel transistor NT5 of the applied external voltage detector 3 are turned on (after which they turn off) based on this initialization signal for a specific period of time after the power supply is turned on.

At this point in the reference voltage generator 1, the connection T3 would be in floating state because the comparator 12 is not operating when the applied external voltage Vex is low (up to approximately 3 V) immediately after the power supply is turned on, and the output of the output buffer 13 is therefore also in floating state. However, because the initialization signal causes the n-channel transistor NT3 to become on immediately after the external power supply is turned on, the connection T3 can be immediately set to a LOW level. Therefore, the p-channel transistor PT8 and n-channel transistor NT4 of the output buffer 13 are respectively on and off, and the level of the output terminal T4 can track the applied external voltage Vex immediately after the external power supply is turned on. Furthermore, with the applied external voltage detector 3, the connection T7 is open i.e. in floating state because p-channel transistors PT12, PT13 and PT14 in the voltage dividing generator 31 are not on immediately after the external power supply is turned on, and the output of the comparator 32 would therefore normally be in floating state. However, by turning the n-channel transistor NT5 on by means of the initialization signal immediately after the external power supply is turned on, the connection T7 can be immediately set LOW. Therefore, the p-channel transistor PT16 of the comparator 32 becomes on, and the output terminal T8 becomes HIGH immediately after the external power supply is turned on. Therefore, it is possible to turn the p-channel transistor PT18 of the internal voltage selector 4 on immediately after the external power supply is turned on, and immediately select the reference voltage generator 1.

As shown in FIG. 2(*b*), the voltage drop circuit 10 comprises a differential amplifier OP11, and a p-channel transistor PT11 connected between the external power supply 5 and internal circuit Z as in a conventional device. A control voltage Vcont (Vref or Va) occurring at the connection T5 of the aging voltage generator 2 is input to the inversion (−) terminal of the differential amplifier OP11 and the internal voltage Vint occurring at the connection T11 between the transistor PT11 and the internal circuit Z is input to the non-inversion terminal (+) of the differential amplifier OP11, which thus controls the conductance of the transistor PT11 so that the potential difference (Vint−Vref) is approximately zero. In other words, this differential amplifier OP11 and transistor P11 form a voltage follower.

It is to be noted that except for those p-channel transistors for which connection wiring is shown in FIG. 2(*a*) (PT13 and PT14), the applied external voltage Vex is applied as the circuit board bias. Furthermore, a circuit board bias potential of −2 to −3 V is applied to the well terminals of the n-channel transistors. In addition, the invertors IV1 to IV4 are driven by the applied external voltage Vex.

A semiconductor integrated circuit as thus described operates in whole as described below.

Figure 3:
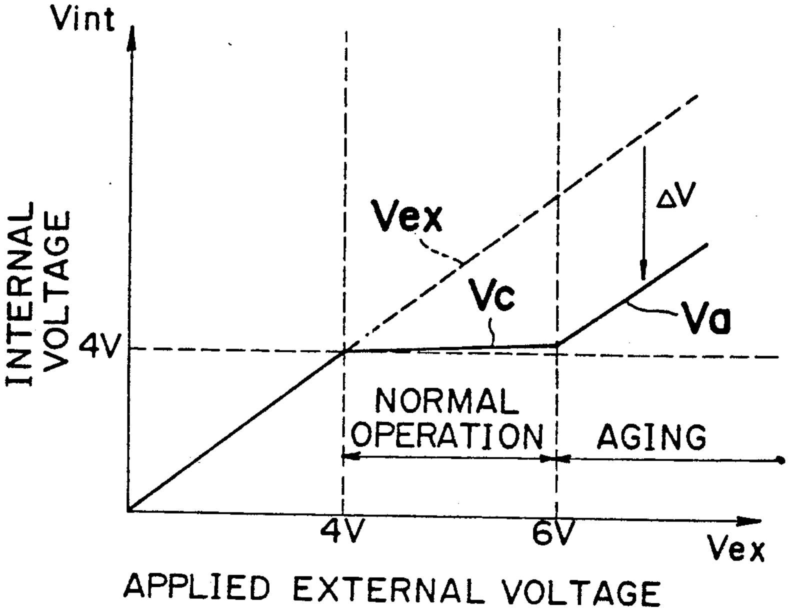
FIG. 3 is a figure showing the relationship between the applied external voltage and the internal voltage.

During normal operation (when applied external voltage Vex=4–6 V), the applied external voltage detector 3 outputs a HIGH level signal to the output terminal T8. Based on this signal, the internal voltage selector 4 outputs LOW and HIGH level signals, respectively, to the output terminals T9 and T10. Thus, the p-channel transistor PT18 becomes on, and the p-channel transistors PT9 and PT10 become off. As a result, the reference voltage generator 1 is selected, and the reference voltage Vref (=4 V) is output as the control voltage Vcont to the output terminal T5. Then, as shown in FIG. 3, an internal voltage Vint approximately equal to the control voltage Vcont =Vref is generated by the voltage drop circuit 10, and applied to the internal circuit Z.

However, during aging (e.g., when the applied external voltage Vex>6 V), the applied external voltage detector 3 outputs a LOW level signal to the output terminal T8 as shown in FIG. 2(*a*). Based on this signal, the internal voltage selector 4 shown in FIG. 2(*b*) outputs HIGH and LOW signals, respectively, to the output terminals T9 and T10. Thus, the p-channel transistor PT18 becomes off, and the p-channel transistors PT9 and PT10 become on. As a result, the aging voltage generator 2 is selected, and the aging voltage Va=Vex−ΔV (where ΔV=2.0–2.4 V) is output to the output terminal T5 as the control voltage Vcont. The aging voltage Va is thus greater than the constant reference voltage and less than the applied external voltage by an essentially constant voltage drop. Then, as shown in FIG. 3, the voltage drop circuit 10 generates an internal voltage Vint approximately equal to the control voltage Vcont=Va, and applies the result to the internal circuit Z.

Thus, according to the semiconductor integrated circuit, the internal voltage Vint approximately equal to a constant reference voltage Vref and lowered from the applied external voltage Vext is applied to the internal circuit Z during normal operation, while a high aging voltage Va in response to the applied external voltage Vext is applied to the internal circuit Z during aging.

Figure 5:
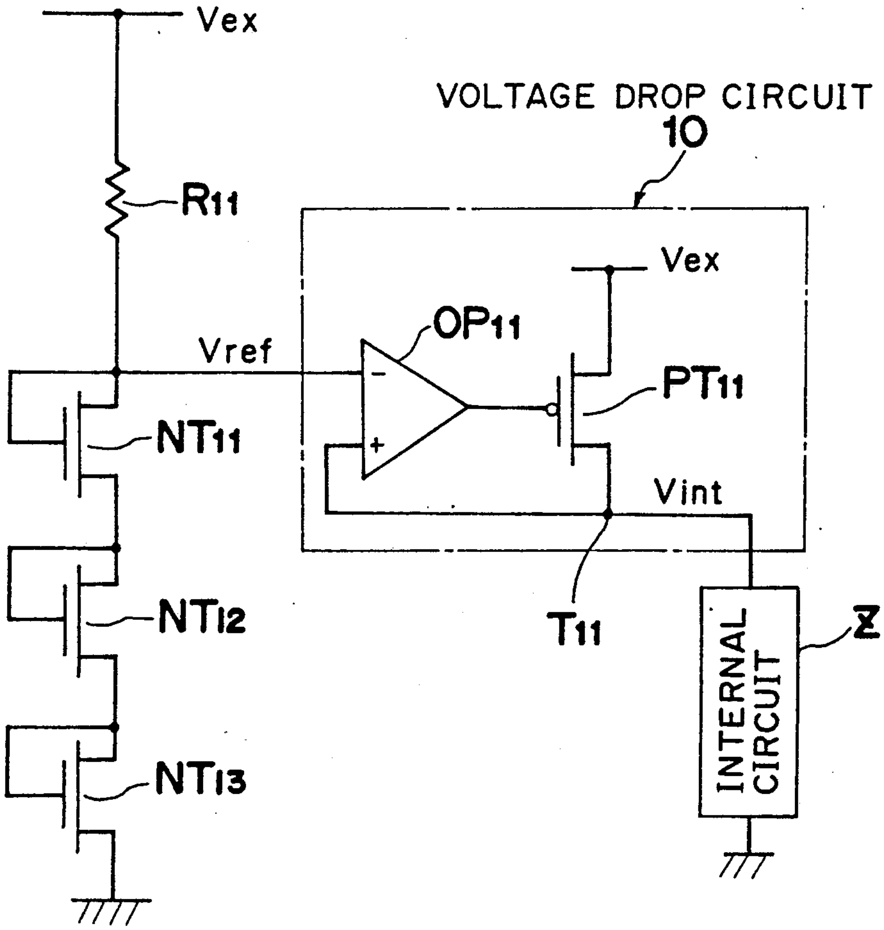
Fig. 5 PRIOR ART
FIG. 5 is a circuit diagram of a conventional semiconductor integrated circuit.
Figure 4:
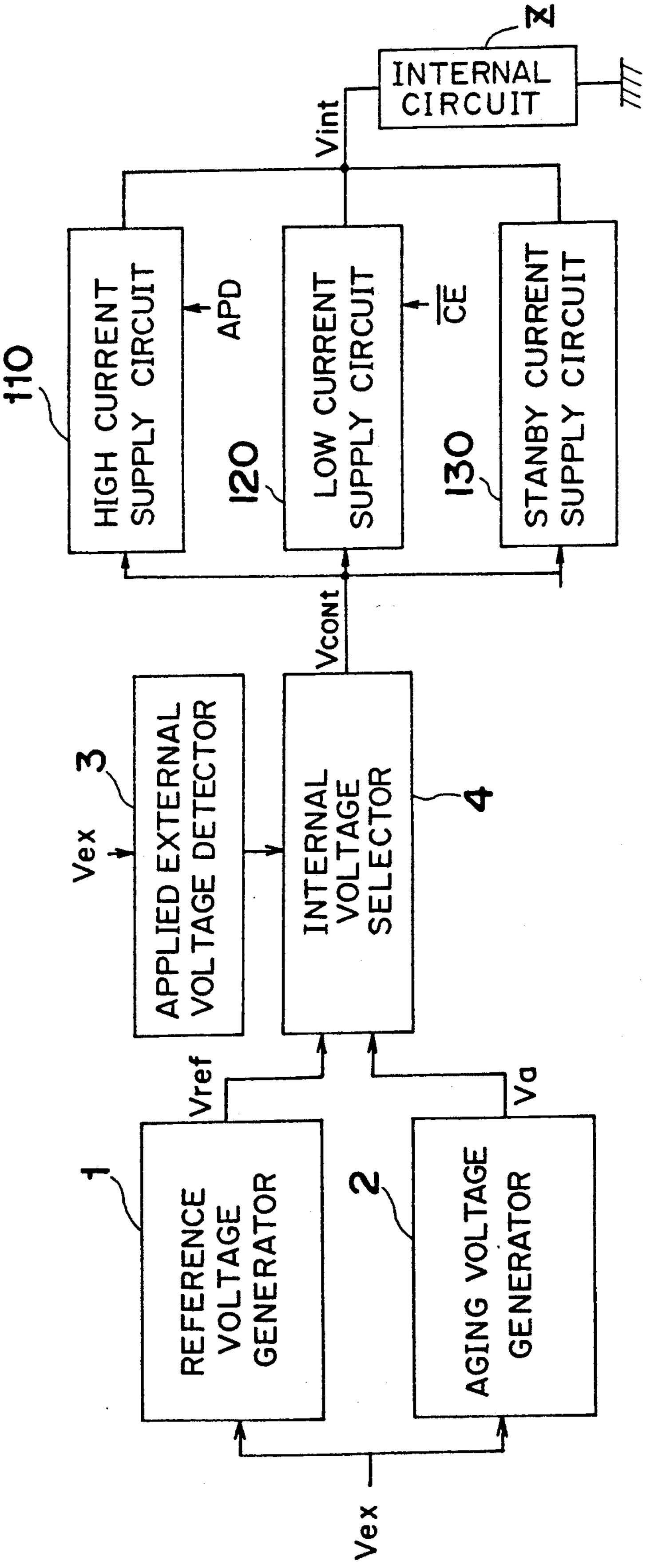
FIG. 4 shows an alternative embodiment of the voltage drop circuit in the semiconductor integrated circuit according to the preferred embodiment.

It is to be noted that the voltage drop circuit 10 as described herein is constructed as is the conventional device shown in FIG. 5, but it shall be not so limited. As shown in FIG. 4, for example, the voltage drop circuit 10 may be comprised of a high current supply circuit 110, low current supply circuit 120, and standby current supply circuit 130 such that any one of these three circuits 110, 120, and 130 operates according to the consumption current level of the internal circuit Z. In this example, the standby current supply circuit 130 operates in the standby mode during which current consumption is lowest. When this semiconductor integrated circuit is selected (the chip enable signal $\overline{CE}$ is active), the low current supply circuit 120 operates, and when the inactivation signal APD is inactive, the high current supply circuit 110 operates.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor integrated circuit which drops an applied external voltage received from an external power supply and applies a dropped voltage to an internal circuit, and which comprises a reference voltage generator which receives the applied external voltage and drops the applied external voltage to generate a constant reference voltage, an aging voltage generator which receives the applied external voltage and generates an aging voltage according to a level of the applied external voltage, an applied external voltage detector which receives the applied external voltage, determines whether a level of the applied external voltage exceeds a threshold level between a normal operating voltage and an aging voltage, and outputs a binary signal expressing the result of this determination, an internal voltage selector which, based on the binary signal output from the applied external voltage detector, selects the constant reference voltage from the reference voltage generator when the applied external voltage does not exceed said threshold voltage, and selects the aging voltage from the aging voltage generator when the applied external voltage does exceed said threshold voltage, and a voltage drop circuit to which is input as a control voltage the constant reference voltage or the aging voltage generated by the reference voltage generator or aging voltage generator, respectively, and selected by the internal voltage selector, and which drops the applied external voltage to a level equal to said control voltage.

2. The semiconductor integrated circuit as claimed in claim 1, further comprising a power on detection circuit, said reference voltage generator and said applied external voltage detector being connected to an output of the power on detection circuit for receiving an initialization signal from the power on detection circuit.

3. A semiconductor integrated circuit which drops an applied external voltage received from an external power supply and applies a dropped voltage to an internal circuit, and which comprises a reference voltage generator which receives the applied external voltage and drops the applied external voltage to generate a constant reference voltage, wherein the reference voltage generator comprises a potential difference generator; a differential amplifier which is formed from a comparator which receives outputs from the potential difference generator and an output buffer which receives an output of the comparator, an aging voltage generator which receives the applied external voltage and generates an aging voltage according to a level of the applied external voltage, an applied external voltage detector which receives the applied external voltage, determines whether a level of the applied external voltage exceeds a threshold level between a normal operating voltage and an aging voltage, and outputs a binary signal expressing the result of this determination, an internal voltage selector which, based on the binary signal output from the applied external voltage detector, selects the constant reference voltage from the reference voltage generator when the applied external voltage does not exceed said threshold voltage, and selects the aging voltage from the aging voltage generator when the applied external voltage does exceed said threshold voltage, and a voltage drop circuit to which is input as a control voltage the constant reference voltage or the aging voltage generated by the reference voltage generator or aging voltage generator, respectively, and selected by the internal voltage selector, and which drops the applied external voltage to a level equal to said control voltage.

4. The semiconductor integrated circuit as claimed in claim 3, further comprising a transistor connected between the ground and a connection which is between the comparator and the output buffer, and a power on detection circuit which receives the applied external voltage from an external power supply and outputs an initialization signal to a control terminal of the transistor and the applied external voltage detector, said initialization signal being a first level immediately after the external power supply is turned on and becoming a second level after a specific period of time after the external power supply is turned on, and, for the specific period, causing a level of output of the reference voltage generator to change together with the applied external voltage and causing the internal voltage selector to select the output from the reference voltage generator through the applied external voltage detector.

5. A semiconductor integrated circuit which drops an applied external voltage received from an external power supply and applies a dropped voltage to an internal circuit, and which comprises a reference voltage generator which receives the applies external voltage and drops the applied external voltage to generate a constant reference voltage, an aging voltage generator which receives the applied external voltage and generates an aging voltage, the aging voltage being (1) greater than the constant reference voltage; and (2) less than the applied external voltage by an essentially constant voltage drop, an applied external voltage detector which receives the applied external voltage, determines whether a level of the applied external voltage exceeds a threshold level between a normal operating voltage and an aging voltage, and outputs of binary signal expressing the result of this determination, an internal voltage selector which, based on the binary signal output from the applied external voltage detector, selects the constant reference voltage from the reference voltage generator when the applied external voltage does not exceed said threshold voltage, and selects the aging voltage from the aging voltage generator when the applied external voltage does exceed said threshold voltage, and a voltage drop circuit to which is input as a control voltage the constant reference voltage or the aging voltage generated by the reference voltage generator or aging voltage generator, respectively, and selected by the internal voltage selector, and which drops the applied external voltage to a level equal to said control voltage.

6. A method of using a semiconductor integrated circuit for dropping an applied external voltage received from an external power supply and for applies a dropped voltage to an internal circuit, the method comprising dropping the applied external voltage to generate a constant reference voltage, using the applied external voltage to generate an aging voltage related to a level of the applied external voltage, determining whether a level of the applied external voltage exceeds a threshold level between a normal operating voltage and an aging voltage, and outputting a binary signal expressing the result of this determination, selecting, on the basis of the binary signal output from the applied external voltage detector, the constant reference voltage from the reference voltage generator when the applied external voltage does not exceed said threshold voltage, and selecting the aging voltage from the aging voltage generator when the applied external voltage does not exceed said threshold voltage, and inputting as a control voltage to a voltage drop circuit either the constant reference voltage or the aging voltage for dropping the applied external voltage to a level equal to said control voltage.

7. The method of claim 6, wherein the aging voltage is (1) greater than the constant reference voltage; and (2) less than the applied external voltage by an essentially constant voltage drop.

* * * * *